United States Patent [19]

Fletcher et al.

[11] 3,808,464

[45] Apr. 30, 1974

[54] HIGH ISOLATION R. F. SIGNAL SELECTION SWITCHES

[76] Inventors: James C. Fletcher, Administrator of the National Aeronautics and Space Administration with respect to an invention of; Michael F. Hanna, 1213 Chesney Ave., Glendora, Calif. 91740; Harry K. Detweiler, 2227 Pinelawn Dr., La Crescenta, Calif. 91214

[22] Filed: Mar. 27, 1973

[21] Appl. No.: 345,372

[52] U.S. Cl. .................. 307/243, 307/215, 307/290, 328/154

[51] Int. Cl. ........................................... H03k 17/62

[58] Field of Search ........... 307/215, 243, 254, 290; 328/104, 154

[56] References Cited

UNITED STATES PATENTS 3,287,499 11/1966 Brightman et al. ............. 307/243 X 3,398,296 8/1966 Sarati et al. ...................... 328/104 X

*Primary Examiner*—John Zazworsky

*Attorney, Agent, or Firm*—Monte F. Mott; John R. Manning; Paul F. McCaul

[57] ABSTRACT

A selection switch with high isolation between R.F. signal input terminals is achieved with a gated Schmitt trigger circuit feeding into a control NAND gate in each signal switching channel. The control NAND gates of the separate signal channels are coupled to an output terminal by a single NAND gate. The schmitt trigger circuits and all gates are implemented with Schottky transistor-transistor logic (TTL) circuits having input clamping diodes. Each Schmitt trigger circuit includes two cascaded NAND gates and a feedback isolation Schottky diode between one input terminal connected to receive an R.F. input and another input terminal connected to receive a feedback signal from the second of the two cascaded NAND gates. Both NAND gates of the Schmitt trigger circuits are enabled by the same switch control signal which enables the control gates.

10 Claims, 2 Drawing Figures

HIGH ISOLATION R. F. SIGNAL SELECTION SWITCHES

ORIGIN OF THE INVENTION

The invention described herein was made in the performance of work under a NASA contract and is subject to the provisions of Section 305 of the National Aeronautics and Space Act of 1958, Public Law 85–568 (72 Stat. 435; 42 USC 2457).

BACKGROUND OF THE INVENTION

This invention relates to R.F. signal selection switches, and more particularly to a digital switching arrangement for selectively coupling R.F. signals to an output terminal with high isolation between R.F. signal channels.

In space communications, it is often desirable to switch between VHF signal channels at a low frequency with greater than 70 db isolation between channels, i.e., 70 db isolation between input terminals, and between unselected (off) input terminals and the output terminal. Digital switching is desirable because it permits remote control, such as when a VHF signal is to be selected for transmission from a spacecraft to earth under control of a base station on earth, or under control of a programming system in the spacecraft.

SUMMARY OF THE INVENTION

According to the present invention, R.F. signal selection under digital control is provided with high isolation (about 100 db) between input terminals of channels, and between the input terminal of an unselected channel and an output terminal, using a gated Schmitt trigger circuit in each channel to couple an R.F. signal at the input terminal thereof to a control NAND gate selected by the same digital signal as the gated Schmitt trigger circuit. All selection gates are coupled to an output channel by another NAND gate. Each Schmitt trigger circuit is comprised of two cascaded NAND gates with feedback from the output of the second to an input of the first. The channel signal is fed to another input terminal of the first NAND gate. The one and the other of the input terminals of the first NAND gate are coupled by a Schottky diode poled to be forward biased by the input signal. All NAND gates are transistor-transistor logic circuits, preferably of the Schottky type, i.e., of the type having an effective Schottky diode clamp between the base and the collector of transistors. Each input terminal of every NAND gate is clamped to circuit ground by a separate Schottky diode.

The novel features that are considered characteristic of this invention are set forth with particularity in the appended claims. The invention will best be understood from the following description when read in connection with the accompanying drawings.

DESCRIPTION OF THE PREFERRED EMBODIMENTS

Figure 1:
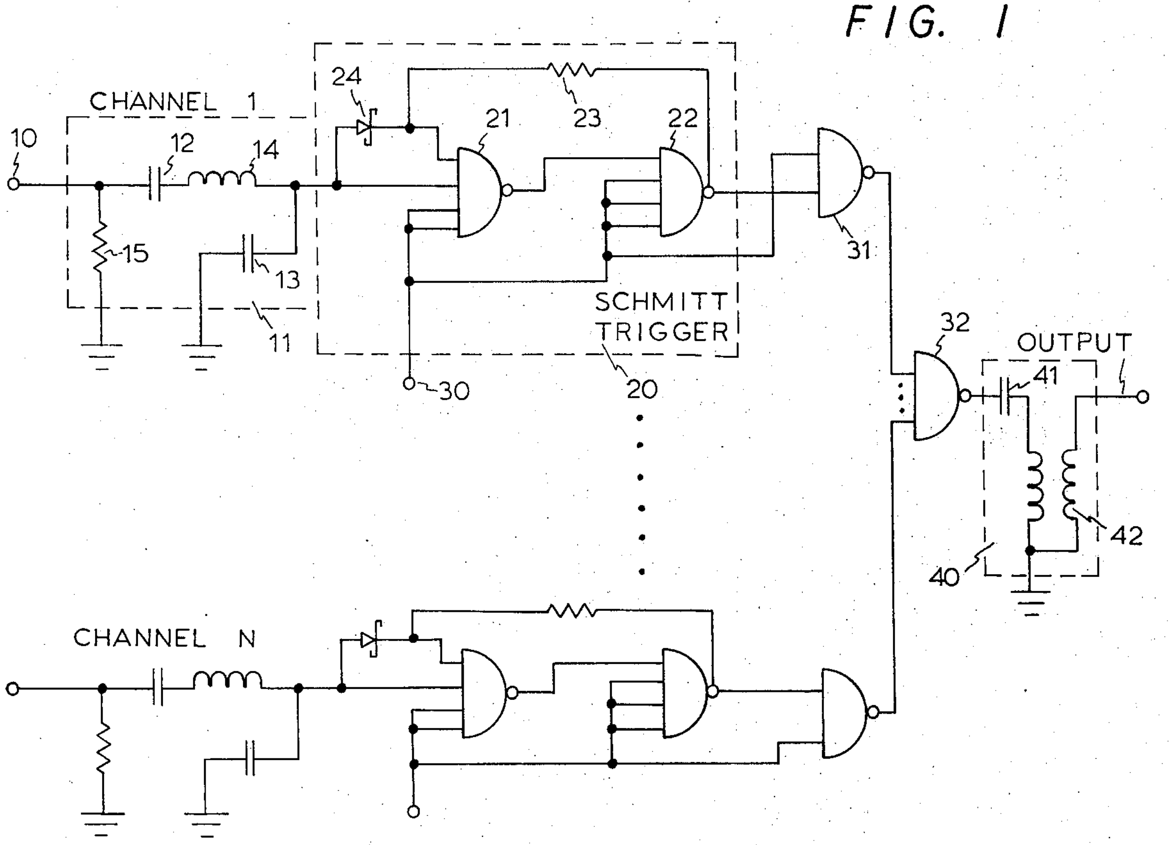
FIG. 1 is a schematic diagram of a preferred embodiment of the present invention.

In FIG. 1 there is shown an R.F. switching network for a plurality of channels 1 through N. Only the first and Nth channel is shown and only the first channel will be described since all channels are the same.

Referring now to channel 1, an input terminal 10 is connected to an R.F. filter and impedance matching section 11 comprised of capacitors 12, 13, inductor 14 and resistor 15. Both the filter characteristic and the impedance matching characteristic is selected to the a-c signal source connected to the input terminal 10.

The output terminal of the section 11 is connected to an input terminal of a Schmitt trigger circuit 20 comprised of NAND gates 21, 22, a feedback resistor 23 and a Schottky diode 24. Each NAND gate is a transistor-transistor logic (TTL) circuit having four input terminals. One input terminal of gate 22 is connected to the output of gate 21 and the rest of the input terminals are connected to a digital control terminal 30. One input terminal of the gate 21 is connected to the feedback resistor 23 and another terminal of the gate 21 is connected to the filter section 11. The remaining two input terminals are connected to the control gate 30. The NAND gates 21, 22, are preferably integrated Schottky transistor-transistor-logic (TTL) circuits packaged together on a common substrate, such as the Texas Instrument type 74S20 which has four input terminals per gate.

Figure 2:
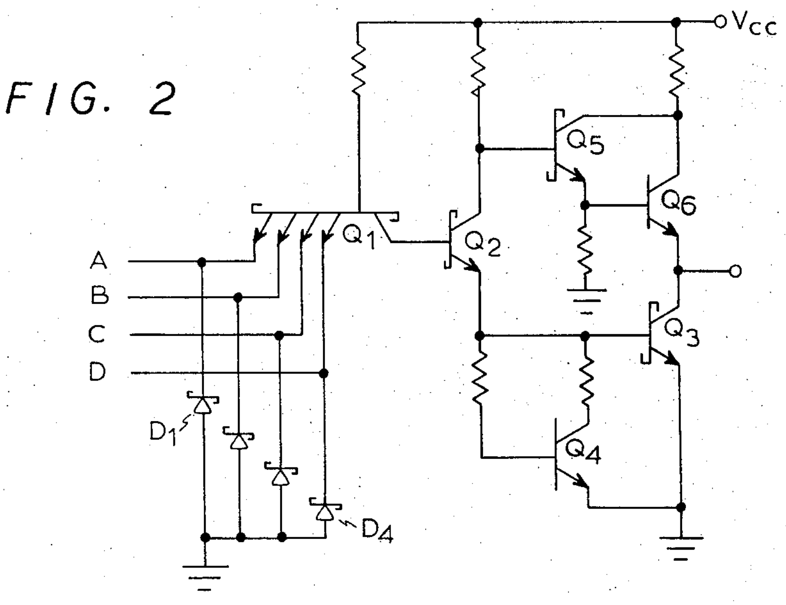
FIG. 2 is a circuit diagram of an integrated-circuit TTL NAND gate employed to implement the invention as shown in FIG. 1.

FIG. 2 illustrates the configuration of an integrated circuit for the NAND gates 21 and 22, and all the remaining NAND gates shown in FIG. 1. The circuit employs the classic TTL design. A transistor $Q_1$ provides the basic NAND logic. Each of four input terminals A, B, C and D, is clamped to circuit ground by a metal-semiconductor (Schottky barrier) diode. These diodes limit negative excursions which exceed about −1 V. When any input terminal is low (below about +0.8V), the transistor $Q_1$ is turned on. All input terminals must be high (about +2V) for the transistor $Q_1$ to be off. Accordingly, when any of the four inputs is low, the output of the gate will be high. Because base current in the transistor $Q_1$ then flows out of one or more of its emitters, and as a result, the collector current in the transistor $Q_1$ will be zero.

Since the collector of the transistor $Q_1$ is connected directly to the base of the transistor $Q_2$, the transistor $Q_2$ will be turned off when the transistor $Q_1$ is on due to a lack of base current. With transistor $Q_2$ off, transistors $Q_3$ and $Q_4$ will also be off. Under those conditions, the base-emitter junction of transistor $Q_5$ is forward biased, thereby turning transistors $Q_5$ and $Q_6$ on. The output terminal will then be high (about +2V).

When all inputs A through D are positive, no current will flow in any of the four emitters of the transistor $Q_1$. Its base current will then flow into its collector and therefore into the base of the transistor $Q_2$, thus turning the transistor $Q_2$ on. The emitter of the transistor $Q_2$ is then sufficiently positive to forward bias the base-emitter junction of transistor $Q_3$, thereby turning the transistor $Q_3$ on.

Transistor $Q_4$ is also turned on while the transistor $Q_2$ is on. Transistor $Q_4$ provides proper bias for the base-emitter junction of transistor $Q_3$. Consequently, the transistor $Q_4$, and its collector and base resistors, may be replaced by a resistor, particularly for switching signals of lower frequencies, i.e., when high speed switching is not of paramount interest. Once the transistor $Q_2$ is turned on, emitter current will be sufficient to quickly turn the transistor $Q_3$ on notwithstanding the current path through the transistor $Q_4$ due to the high impedance through that alternate current path. Once the transistor $Q_3$ is turned on, the output terminal is low (about +0.8 V).

It is evident that the dual NAND gates 21, 22, could be of a configuration having three input terminals, such as the Texas Instrument type 74S10, in which case the gate 22 would have only two input terminals connected to the control terminal 30, and the gate 21 would have only one input terminal connected to the control terminal 21. The type 74S10 provides three gates on a common substrate, each with three input terminals. The third gate could then be used as a control gate 31.

The control gate 31 has two input terminals, one terminal connected to the output of the Schmitt trigger circuit 20 and the other connected to the control terminal 30. While the control terminal 30 is high, the gate 31 will function as an inverter coupling the Schmitt trigger circuit to a NAND gate 32. The latter functions as an inverter coupling the enabled control gate to an output impedance matching section 40 comprised of a d-c isolating capacitor 41 and an impedance matching transformer 42. When the gate 31 is not enabled, its control input is low and its output is high. With all channel control gates disabled except one, all input terminals of the gate 32 will be high, except one. That one connected to an enabled control gate will alternate between low and high at the frequency of the R.F. input. Consequently, the output of the gate 32 will follow the R.F. input to the channel of the enabled control gate.

In operation, one channel is enabled at a time by a high (+2 V) signal at its control terminal. As the input R.F. signal reaches the high digital logic level (+2 V) the first gate 21 of the Schmitt trigger circuit is further enabled, but it will not be turned on until the fourth input terminal is driven to a high level through the diode 24. Once that occurs, the output of gate 21 is driven low and the output of enabled gate 22 goes high. That high output is fed back via resistor 23 to hold the fourth input terminal of the gate 21 high after the input signal starts to go down below the point of forward biasing the diode 24. The Schmitt trigger output will then follow the input signal and go low when the input signal drops below about 0.8 V.

The function of the diode 24 is to isolate the feedback from the input signal and thereby effectively create a hysteresis in the operation of the Schmitt trigger circuit which would otherwise not be present if the feedback were connected to the input terminal receiving the input signal directly. As the input signal rises in voltage, the turn on level of the gate 21 is reached (at about +2 V), but the diode 24 prevents the gate 21 from turning on until the rising input signal reaches a sufficiently higher level to forward bias the diode 24. The gate 21 will then have all input terminals high so that its output terminal will be low. Immediately, the input transistor of gate 22 is turned on, driving the output terminal of the Schmitt trigger circuit high. That high output signal is then fed back through the resistor 23 to the junction between the diode 24 and the fourth input terminal of the gate 21.

As the input signal begins to drop, the diode 24 will be reversed biased well before the input signal drops below the level of the output signal being fed back to the gate 21. Consequently, the output of the gate 21 remains low until the input signal from the filter 11 is low enough to draw emitter current from the input transistor of the NAND gate 21. This causes the output of the gate 21 to go high. With all input terminals of the gate 22 high, the output terminal of the Schmitt trigger circuit switches to a low level. That low level signal is fed back to the gate 21 to hold its output high through the next half-cycle of the input signal until the input signal is again sufficiently above the threshold level of the gate 21 to forward bias the diode 24 and turn the input transistor of the gate 21 off.

If this hysteresis were not provided by the diode 24, there would be a tendency for the Schmitt trigger circuit to "chatter" at both the turn on point and the turn off point of the Schmitt trigger circuit, thus introducing noise in the channel. Otherwise, the feedback resistor 23 could be connected directly to the junction between the input filter 11 and the third input terminal of the gate 21. Consequently, the diode 24 is necessary for noise free switching but it could be replaced by a resistor. That would achieve the desired hysteresis, but a diode and particularly a Schottky diode, is to be preferred for high speed switching at the high carrier frequencies for which the channel switching system is intended, namely for carrier signals at frequencies up to 30 MHz.

Still other Schmitt trigger circuit configurations may be used without significantly degrading the desired isolation. It is essential, however, that the Schmitt trigger circuit be gated, i.e., enabled when the channel control gate is enabled, and disabled when the channel control gate is disabled, and that it be implemented with TTL gates.

Each of the TTL NAND gates in the Schmitt trigger circuit, and the remaining TTL NAND gates in the channel switching arrangement shown, namely NAND gate 31 for channel 1, and corresponding control NAND gates for the remaining channels, and the NAND gate 32 common to all channels, are preferably Schottky type TTL gates (sometimes referred to as Schottky-clamped gates) which are produced utilizing conventional integrated circuit techniques of selectively diffusing impurities through the surface of a semiconductor wafer. The base contact area is extended beyond the base diffusion region and over the collector diffusion region. Metallization is then deposited over both the base and collector regions to serve as the transistor base contact and the anode of a Schottky barrier diode having as its cathode the collector of the transistor. For a description of a transistor having a Schottky barrier diode clamping or shunting the base-collector junction, see U.S. Pat. No. 3,463,975. That Schottky clamping diode is present in each of the transistors $Q_1$ through $Q_5$ of each of the NAND gates, and is indicated in FIG. 2 by a symbol for those transistors which can be distinguished from a conventional symbol for a transistor as shown for transistor $Q_6$ in that the base is turned up and in at one end and down and in at the other. Each of the emitter clamping diodes $D_1$–$D_4$ is also shown to be a Schottky barrier diode for high speed switching. Again, the base (cathode) is turned up and in at one end and down and in at the other to signify that it is a Schottky barrier diode. The same symbol is used for the diode 24 in the Schmitt trigger circuit to indicate it is a Schottky barrier diode.

With high speed switching elements in the channel switching system, high isolation (about 100 db) is achieved at high frequencies up to about 30 MHz. For lower frequencies, such as frequencies below 19.125 MHz, Schottky-clamped TTL gates need not be used since the Schottky barrier diodes serve primarily to increase switching speeds, and not to achieve the high isolation between channels and between input terminals of separate channels and the output terminal of the channel switching system. In other words, at low speeds plain TTL gates may be used having at least an input transistor $Q_1$ operating as a current switch to control the base current of a control transistor and "totem pole" output transistors $Q_3$ and $Q_6$ only one of which is turned on at one time by the control transistor according to the level of the logic signal applied to the input transistor.

By gating the Schmitt trigger circuit with the selection control signal as well as the control gate in each channel, more than 100 db isolation is achieved at frequencies to about 30 MHz with an input power level of +3 dBm and an output power level of +12.5 dBm from an enabled switch. A typical on/off ratio has been measured to be 110 to 118 db between input and output terminals of a channel. Isolation between input terminals of two adjacent channels, with one of the two channels gated on has been measured to be 51 db, but can also be expected to be above 100 db by proper shielding between channels.

It is evident that the input and output filters may not be required for some applications. Where they are included, the input filters may be bandpass filters for the respective channels and the output filter may then be a sufficiently broad bandpass filter to accommodate all of the channels. However, when not included, impedance matching may nevertheless be desired, in which case impedance matching circuits of other configurations may be employed. Consequently, it is to be understood that the invention is comprised of a plurality of gated channels connected to the output TTL NAND gate, where each channel is comprised of a gated Schmitt trigger circuit connected to receive a channel signal at its input and a control TTL NAND gate coupling the output of the Schmitt trigger circuit to the output TTL NAND gate. While only 70 db isolation was expected from this arrangement, more than 100 db isolation was achieved. No other channel switching arrangement known or tested would yield more than about 50 db isolation without employing isolation techniques that would cost more to implement than this switching channel arrangement by more than a factor of about 10.

In an exemplary embodiment for selective switching of a carrier signal at a frequency of 19.124 MHz into a 50Ω load, the following components were used with Texas Instrument 74S20 NAND gates:

Capacitor 12 — 2 K pf
Capacitor 13 — 15 pf
Inductor 14 — 3.3 μh
Resistor 15 — 220 Ω
Resistor 23 — 1 K
Diode 24 — H-P 2817-017
Capacitor 41 — 2 K pf
Transformer 42 — 25 Ω: 50 Ω

Although particular embodiments of the invention have been described and illustrated herein, it is recognized that modifications and equivalents may readily occur to those skilled in the art and consequently it is intended that the claims be interpreted to cover such modifications and equivalents.

What is claimed is:

1. A system for R.F. signal selection under control of low level binary signals with high isolation between input terminals of a plurality of selection channels, and between the input terminal of an unselected channel and an output terminal to which a selected signal is coupled by one of said selection channels, each of said channels being coupled to an output terminal by means comprising a NAND gate having an output terminal and a plurality of input terminals, one input terminal for each channel, and each of said channels comprising a gated Schmitt trigger circuit in cascade with a control NAND gate, said Schmitt trigger circuit comprising two NAND gates in cascade and a feedback resistor connected between the output of the second of said two NAND gates to an input terminal of the first of said two NAND gates, each of said two NAND gates and said control NAND gate being enabled by a low level binary control signal at distinct input terminals thereof to function as digital logic gates, the first of said two NAND gates of said Schmitt trigger circuit having voltage reducing means connected between a distinct input terminal thereof connected to receive an input R.F. signal and said input terminal connected to said feedback resistor, each of said NAND gates being a transistor-transistor-logic circuit comprised of a plurality of transistors of the same conductivity type including an input transistor having a plurality of emitters, each connected to receive an input signal, a base connected to a voltage source by a resistor, and a collector; a control transistor having a base connected directly to said collector of said input transistor, a collector connected to said source of voltage, and an emitter; and a pair of output transistors, one having its emitter and the other having its collector connected directly to an output terminal, said one transistor having its collector connected to said source of voltage and a base connected to said collector of said control transistor by direct current means, and said other transistor having an emitter connected to circuit ground and a base connected to said emitter of said control transistor by direct current means.

2. A system as defined in claim 1 wherein said voltage reducing means connected between distinct input terminals of said Schmitt trigger circuit is diode poled to be forward biased when said input R.F. signal increases in amplitude with a given polarity necessary to turn off the input transistor of said first of said two NAND gates of said Schmitt trigger circuit.

3. A system as defined in claim 2 wherein said diode is a Schottky barrier type of diode.

4. A system as defined in claim 3 wherein each of said emitters of said input transistor of each NAND gate is clamped to circuit ground by a distinct clamping diode poled to be forward biased by an input signal of a polarity opposite said given polarity.

5. A system as defined in claim 4 wherein each of said clamping diodes is a Schottky-barrier type of diode.

6. A system as defined in claim 5 wherein each of said input transistor and said control transistor of each NAND gate has its collector clamped to its base by a Schottky-barrier diode junction therebetween.

7. A system as defined in claim 6 wherein said output transistor of each NAND gate having its emitter connected to circuit ground has its collector clamped to its base by a Schottky-barrier diode junction.

8. A system as defined in claim 7 including a distinct impedance matching section coupling each input signal to a distinct input terminal of said plurality of selection channels.

9. A system as defined in claim 8 including an output impedance matching section connected to said output terminal to which a selected signal is coupled by one of said selection channels, said output impedance matching section being adapted to said output terminal to a load.

10. A system as defined by claim 9 wherein each of said distinct impedance matching sections coupling input signals to input terminals includes a filter characteristic selected for the input signal coupled to an input terminal.

* * * * *